United States Patent [19]
Amann et al.

[11] Patent Number: 5,784,398
[45] Date of Patent: Jul. 21, 1998

[54] OPTOELECTRONIC COMPONENT HAVING CODIRECTIONAL MODE COUPLING

[75] Inventors: Markus-Christian Amann, Baunatal; Stefan Illek, Feldkirchen-Westerham, both of Germany

[73] Assignee: Siemens Aktiengesellschaft, Munich, Germany

[21] Appl. No.: 731,451

[22] Filed: Oct. 15, 1996

[30] Foreign Application Priority Data

Oct. 13, 1995 [DE] Germany .................. 195 38 232.3

[51] Int. Cl.$^6$ ................................................. H01S 3/19
[52] U.S. Cl. ................................................. 372/50; 372/45
[58] Field of Search .................... 372/20, 19, 26, 372/28, 45, 50, 96, 102

[56] References Cited

U.S. PATENT DOCUMENTS

| | | | |
|---|---|---|---|
| 4,932,032 | 6/1990 | Koch et al. | 372/45 |
| 4,944,838 | 7/1990 | Koch et al. | |
| 5,093,835 | 3/1992 | Takemoto et al. | 372/45 |
| 5,143,864 | 9/1992 | Takemoto et al. | 437/129 |
| 5,208,824 | 5/1993 | Tsang | 372/96 |
| 5,325,379 | 6/1994 | Amann | 372/20 |
| 5,452,318 | 9/1995 | Makino et al. | 372/96 |
| 5,539,766 | 7/1996 | Ishino et al. | 372/96 |

FOREIGN PATENT DOCUMENTS

| | | |
|---|---|---|
| 0 411 816 | 2/1991 | European Pat. Off. |
| 0 552 390 | 7/1993 | European Pat. Off. |
| 44 29 586 | 2/1995 | Germany |

OTHER PUBLICATIONS

Amann et al, "Widely Tunable Laser Diodes with Tapered Index Perturbations for Reduced Internal Reflecitons and Improved Wavelength Access", Electronics Letters, vol. 32, No. 3, pp. 221–222, Feb. 1996.

Amann et al, "Distributed Forward Coupled (DFC) Laser" IEEE Journal of Selected Topics in Quantum Electronics, vol. 1, No. 2, Jun. 1, 1995, pp. 387–395.

Amann et al, "Widely tunable laser diodes with tapered index perturbations for reduced internal reflections and improved wavelength access", Electronics Letters, vol. 32, No. 3, Feb. 1, 1996 pp. 221–222.

I. Kim et al, "Broadly tunable vertical–coupler filtered tensile–strained InGaAs/InGaAsP multiple quantum well laser", Applied Physics Letter, vol. 64, No. 21, 23 May 1994, pp. 2764–2766.

Amann et al, "Widely tunable Distributed Forward Coupled (DFC) Laser", Electronics Letters, vol. 29, No. 9, 29 Apr. 1993, pp. 793–794.

Rast et al, "Gain–Coupled Strained Layer MQW–DFB Lasers with an Essentially Simplified Fabrication Process for $\lambda=1.55$ µm", IEEE Photonics Technology Letters, vol. 7, No. 8, Aug. 1995, pp. 830–832.

*Primary Examiner*—Rodney B. Bovernick
*Assistant Examiner*—Quyen Phan Leung
*Attorney, Agent, or Firm*—Hill & Simpson

[57] ABSTRACT

An optoelectric component has two waveguide layers and a layer with a periodic structure, which layers are arranged parallel to one another and are dimensioned so that a codirectional coupling is produced between modes guided in each of the waveguide layers. In order to prevent undesirable reflections, changes in the effective refractive index in the periodic structure is gradually changed along the direction of propagation. This change can be by the boundary of the periodic structure extending at an angle other than a right angle to the direction of propagation, either in a vertical or a lateral direction. The change can also be accomplished by a gradual change of the composition at the boundary of the periodic structure and adjacent portions or sections.

11 Claims, 3 Drawing Sheets

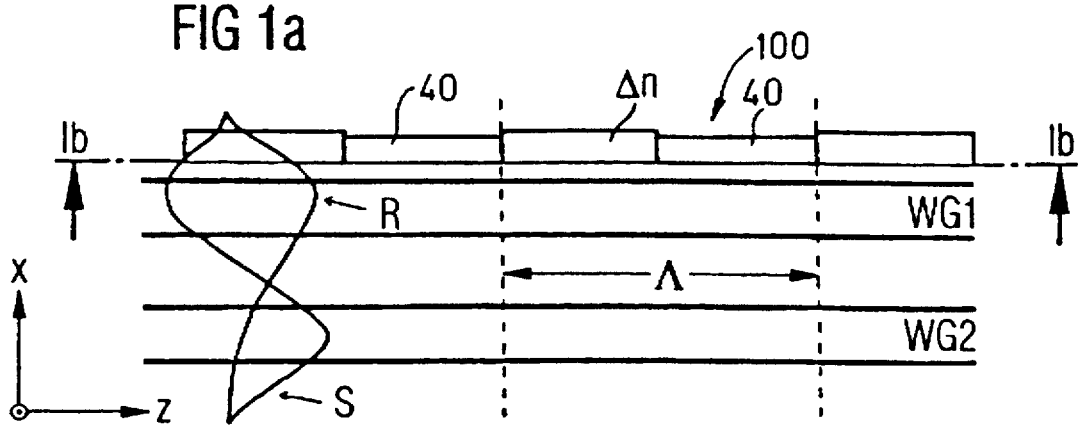
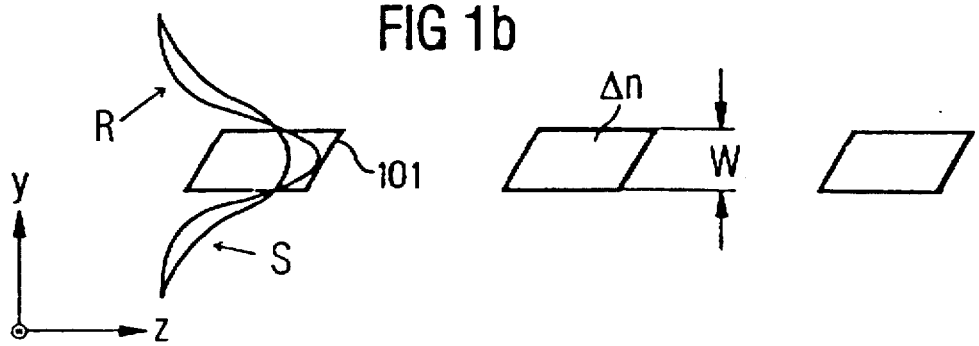
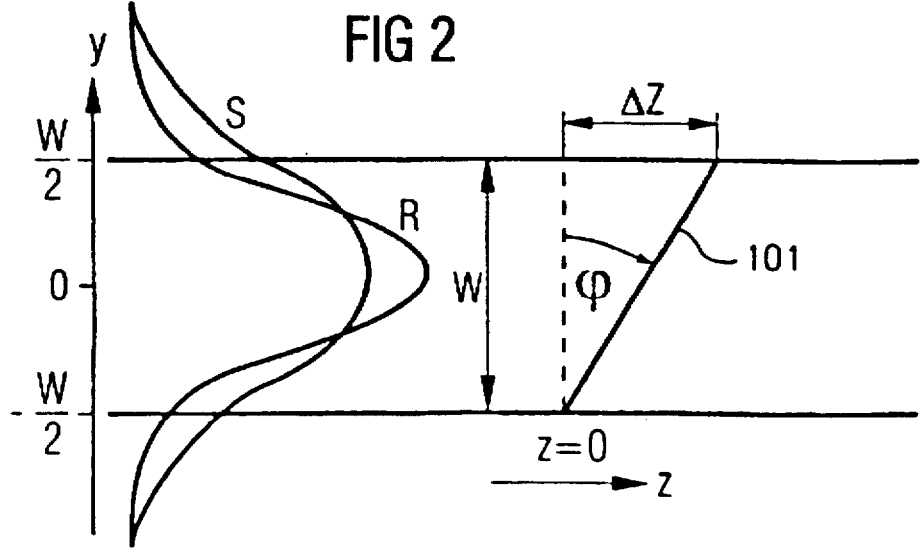

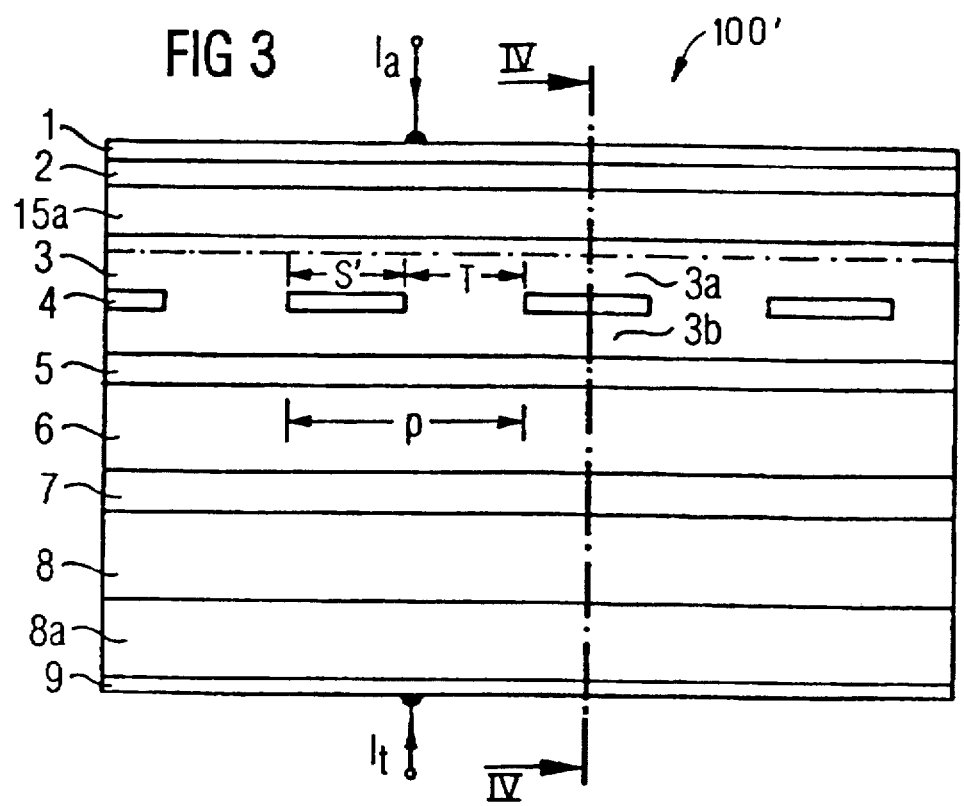
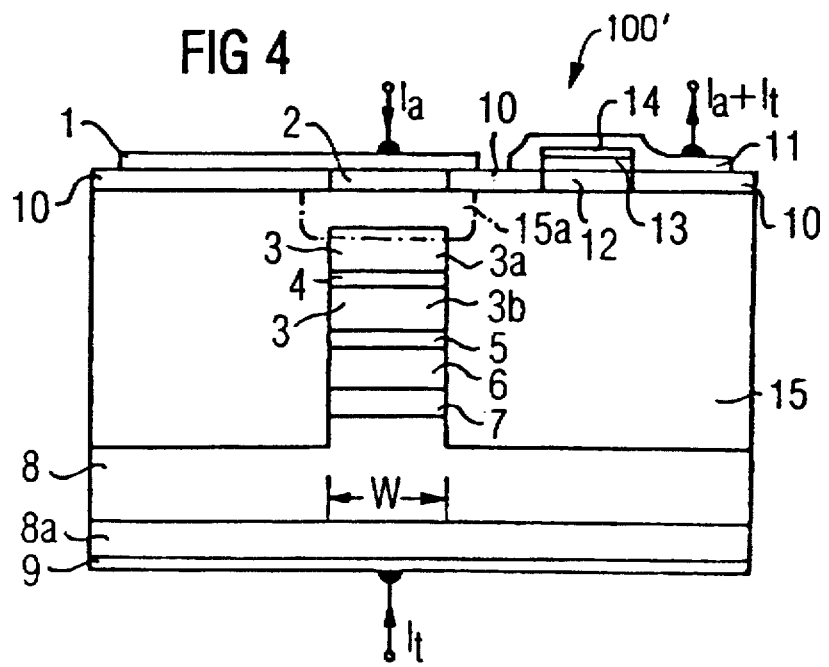

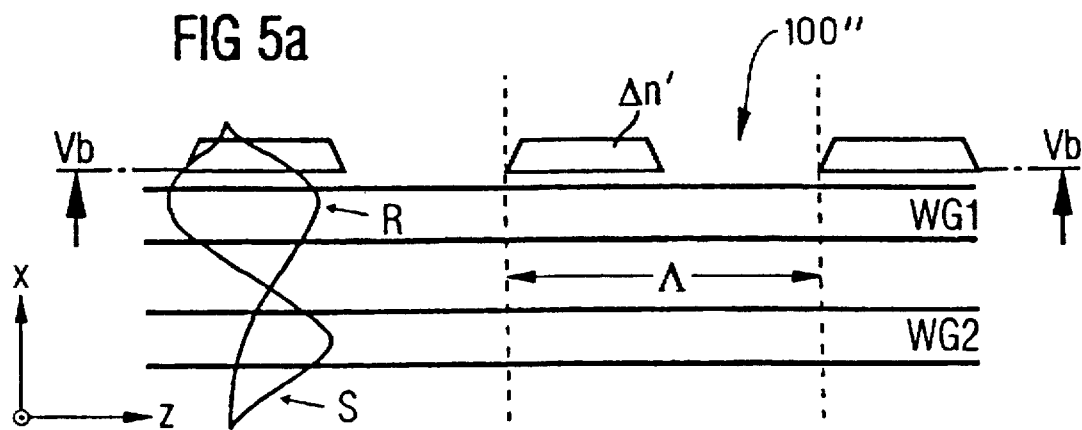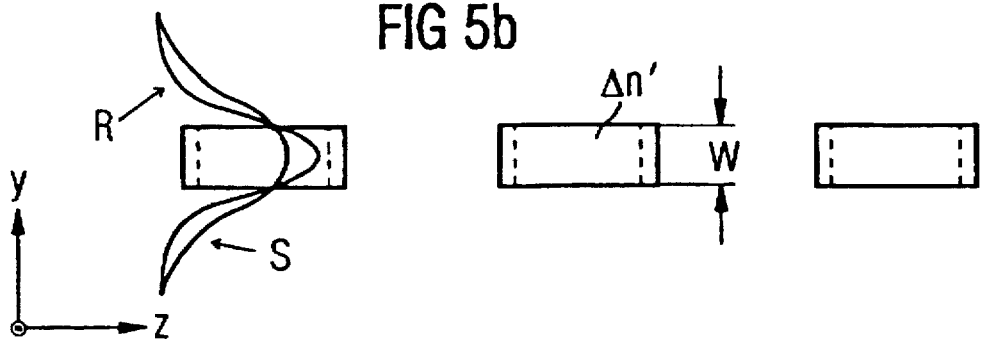

OPTOELECTRONIC COMPONENT HAVING CODIRECTIONAL MODE COUPLING

BACKGROUND OF THE INVENTION

Electronically tunable integrated laser diodes having a large tuning range, that is to say greater than approximately 1% of the wavelength, are key components for multifarious or multiple applications in optical communication engineering. Previously known designs of laser diodes, which have codirectional mode coupling require only a single tuning current, are advantageous. These laser diodes are described, for example, in a publication by I. Kim et al "Broadly tunable vertical-coupler filtered tensile-strained InGaAs/InGaAsP multiple quantum well laser", Applied Physics Letter, Vol. 64, No. 21, 23 May 1994, pp. 2764–2766 and Amann et al "Widely Tunable Distributed Forward Coupled (DFC) Laser", Electronics Letters, Vol. 29, No. 9, 29 Apr. 1993, pp. 793–794.

In codirectional mode coupling, two waves or transverse modes running in the same direction are coupled to one another via a grating. This coupling is wavelength-selective and current- or voltage-tunable, with the result that the longitudinal laser modes, arranged at equidistant wavelength intervals, can be made to start oscillating as a function of the tuning current or of the tuning voltage. However, because of the periodic inhomogeneities which are introduced into the laser resonator by the grating structure, additionally disturbing retroreflections (contradirectional coupling) are produced. Depending on the wavelength and the phase angle, this can variously produce constructive or destructive interference for each longitudinal mode. Consequently, and because of the relatively weak wavelength selectivity of the codirectional mode coupling, it is therefore generally not possible to individually select all possible longitudinal laser modes, with the result that in practice, only a small number of discrete wavelengths are available within the tuning range. So far, the filter properties and spectral distribution have been investigated for these lasers without taking into account of any internal retroreflection. Consequently, so far, it has not been possible to achieve a theoretically calculable mode selection and sideband suppression for the majority of the longitudinal modes (see above-mentioned publications).

U.S. Pat. No. 5,325,379, whose disclosure is incorporated herein by reference thereto and which corresponds to European 0 552 390 A1, describes a tunable laser diode in which codirectional mode coupling is produced by a periodic interrupted absorber layer arranged parallel to two waveguide layers. Discontinuities in the real part of the effective refractive index in the waveguide layers occurs in each case at the longitudinal edges of the individual sections of the absorber layer. The internal retroreflections therefore occur at periodic intervals in this laser diode.

U.S. Pat. Nos. 4,932,032 and 4,944,838, whose disclosures are both incorporated herein by reference thereto and which correspond to European 0 411 816 A2, describe the production of waveguide tapers, which taper in the vertical direction. The waveguide is formed by a multiplicity of InGaAsP layers with interposed InP etching stop layers. The taper is produced by stepwise etching of this layer structure.

Laser diodes with a gain-coupled grid structure are disclosed in U.S. Pat. Nos. 5,208,824; 5,452,318; 5,143,864; 5,093,835 and 5,539,766, which corresponds to German DE 44 29 586 A1 and by the article by Rast et al "Gain-Coupled Strained Layer MQW-DFB Lasers with an Essentially Simplified Fabrication Process for λ=1.55 μm", IEEE Photonics Technology Letters, Vol. 7, No. 8, Aug. 1995, pp. 830–832.

The disclosure of each of the above-mentioned U.S. Patents are incorporated herein by reference thereto.

SUMMARY OF THE INVENTION

An object of the present invention is to provide an optoelectric component having a codirectional mode coupling in which undesired internal retroreflections of the guided modes are suppressed, if possible.

This object is achieved by means of an improvement in an electro-optical component in which two waveguide layers and a layer with a periodic structure are present and are arranged parallel to one another and are dimensioned so that codirectional coupling is produced between modes guided in these waveguide layers. The improvement is discontinuities, which are not required for the coupling and are, therefore, undesirable, in the real parts of the refractive index, which are decisively effective for the wave guidance of these modes are avoided owing to the fact that means for gradually changing the refractive index are present in either the periodic structural layer or an additional layer which is changed in the direction provided for the propagation of the modes. This means for changing may be either in a vertical plane or a lateral plane with reference to the direction of propagation, and the change may be in the boundary of the relevant layer in a direction either perpendicular to the direction of propagation or transverse to the direction of propagation at an angle in the layer plane, which is different from a right angle. It is also possible that the change is continuous in the vertical dimension of the structural layer or additional layer, owing to the fact that the boundary extending transverse to the direction of propagation of the modes of the relevant layer are aligned with respect to this direction of propagation at an angle perpendicular to a layer plane which differs from a right angle.

The present invention solves the problem by virtue of the fact that at the points at which in conventional components having codirectional mode coupling discontinuities in the refractive index occur, tapers, that is to say gradual changes in the lateral or vertical dimensions, or graded compositions of the semiconductor mixed crystals are present in or on the layers or layer structures responsible for these discontinuities. These measures, according to the invention, replace the discontinuities in the refractive index by continuous or at least multiple step transitions. The waves partially reflected over the entire length of these continuous transitions interfere destructively, as a result of which no reflections, or only small ones, occur. The codirectional coupling in the forward direction is, by contrast, only slightly influenced. At the boundaries between the regions of the different materials, which follow one another in the direction of propagation of the modes in a grating producing the coupling, the gradual increase in the lateral dimensions of these regions can be achieved, for example, by virtue of the fact that these boundaries in the grating are arranged not at an a right angle to the direction of propagation of the mode, but obliquely thereto. This results in a structuring of the grating layer which tapers in the direction of the propagation in the waveguide. In a periodic absorber layer, each edge or boundary of a section of this absorber layer, which extends transverse to the direction of the propagation of the modes, can, for example, form a taper of this section. In the case of a grating formed by corrugations or periodic thickness fluctuations in a continuous layer, according to the present invention, these corrugations or other types of periodic structuring are aligned obliquely relative to the direction of propagation of the modes if the discontinuities in the real part of the effective refractive index are undesired in the direction of propagation. If the coupling is performed by the periodic change in the real part of the effective refractive index, a tapered expansion or narrowing is provided, for example only at the edges of the grating layer, which are at the front and rear of the direction of propagation of the modes. These edges extend, for example, obliquely relative to the direction of propagation of the modes, while the gating itself is structured in a conventional way. An alternative is the possibility of using a continuous change in the refractive index by means of a graded change in the composition of the semiconductor mixed crystal of a quaternary or ternary semiconductor material used for the relevant layer.

Other advantages and features of the invention will be readily apparent from the following description of the preferred embodiments, the drawings and claims.

BRIEF DESCRIPTION OF THE DRAWINGS

FIG. 1a is a side view showing the elements essential for the structure of the component;

FIG. 1b is a plan view taken along the lines 1b—1b of FIG. 1a;

FIG. 2 is an enlarged detail view of a portion of FIG. 1b;

FIG. 3 is a longitudinal cross sectional view taken along the direction of propagation in the conventional component;

FIG. 4 is a cross sectional view taken along the lines IV—IV of FIG. 3;

FIG. 5a is a side view similar to FIG. 1a of an alternative configuration for the component; and FIG. 5b is a plan view taken along the lines Vb–Vb of FIG. 5a.

DESCRIPTION OF THE PREFERRED EMBODIMENTS

The principles of the present invention are particularly useful when incorporated into a component generally indicated at 100 in FIG. 1a. The component in FIG. 1a has two waveguides WG1 and WG2 and a periodically structured layer $\Delta n$ by means of which the codirectional coupling is produced. Owing to the periodic change in the refractive index as an effect of the periodically structured layer (filter layer or absorber layer), the modes guided in the waveguide layers WG1 and WG2 are coupled at a wavelength which is equal to the product of the period $\Lambda$ and the difference in the real part of the effective refractive index of the two modes. Lacking the inventive measures represented in FIG. 1b, undesired discontinuities occur in the effective refractive index at the edges of the individual sections $\Delta n$ of FIG. 1a of the periodic structured layer if the propagation of the modes is performed in the direction of the illustrated z-axis. Because of the manufacturing tolerances of at least 0.1 μm, the various reflections at these points of discontinuity exhibit statistically distributed phase differences, with the result that some of the longitudinal modes are not available as a result of randomly distributed constructive or destructive interferences. Therefore, according to the invention, in accordance with the representation of FIG. 1b, the edges 101 of the parts of the layer $\Delta n$ are beveled or tapered in such a way that, in the longitudinal direction of the waveguides, these parts of the layers $\Delta n$ gradually widen and/or narrow laterally and, in this way, a continuous change in the real part of the effective refractive index is produced in the waveguide layers.

As illustrated in FIG. 2, the modes are propagated in the direction of the illustrated z-axis. On the right-hand side, a part of the periodic structured layer $\Delta n$ is illustrated, whose edge 101 encloses an angle $\phi$ with the perpendicular to the longitudinal direction of the waveguide in the layer plane. The result is thus a path length $\Delta Z$, as illustrated, at which the real part of the effective refractive index experiences a continuous change. The width of the layer $\Delta n$ corresponds, in this embodiment, to the width W of the waveguide layers WG1 and WG2. In FIG. 2, the codirectional coupling modes R and S are illustrated on the left-hand side by the amplitude of their field strength. In this arrangement, the overall reflection results as the integral along the path $\Delta Z$. If the phase difference $2k_0 n_z \Delta Z$ which occurs in a mode with an effective refractive index $n_z$ and the wave number $k_0 = 2\pi/\lambda_0$ is greater than $2\pi$, during integration, the reflection components are extinguished by strong destructive interference. On the other hand, however, there is also a reduction in the codirectional coupling in the case of continuous transitions of the refractive indices. However, this influence is approximately 2 orders of magnitude lower, since here it is not the propagation time or phase angle of the individual transverse modes R or S which is decisive, it is rather a question of the difference in the propagation time or phase of the modes upon transversal of the path length $\Delta Z$. There is, therefore, a large value range for $\Delta Z$ within which, on the one hand, destructive interference of the reflection and a reduction in the overall reflection occur, while, on the other hand, the codirectional mode coupling is not yet perceptibly impaired. The result for the possible value $\Delta Z$ is, therefore, arranged between half the wavelength of the laser in a vacuum, divided by the mean effective refractive index of the transversal modes R and S, and a quarter of the wavelength of the laser in a vacuum, divided by the difference between the effective refractive index of the modes. Typical values are, for example 1.55 μm for the vacuum wavelength, 3.3 for the mean effective refractive index and 0.1 for the difference between the effective refractive indices of the modes in the case of an InGaAsP laser diode. The result is a permissible interval for $\Delta Z$ of 0.25 μm to 4 μm, as a typical value. For example, with a width W of 2 μm for the wavelength strip and an angle $\phi$ of 30° for the tapered oblique position of the boundaries of the parts of the structured layer $\Delta n$, the calculated reduction in the power reflection is a factor of 100 to 10,000, depending on the strength of the lateral wave guidance. Such a pronounced reduction in reflection produces a decisive improvement in the characteristics of the laser diode.

A possible embodiment of the component is illustrated as a laser diode, generally indicated at 100' in FIGS. 3 and 4. In this embodiment, the waveguide layers 5 and 7 are arranged vertically relative to one another and to a periodically interrupted absorber layer 4. Located one above the other on a substrate 8a, whose thickness is not shown to scale in the drawing, are a cladding layer 8, which is doped in a p-type fashion like the substrate 8a. A lower waveguide 7 is arranged on the cladding layer 8, then an intermediate layer 6 is on the layer 7 and the upper layer 5 is on the intermediate layer 6. The absorber layer 4, which is arranged between upper and lower parts 3a and 3b of a cladding layer, which is also doped for p-type conduction, is disposed on the upper layer 5 and is covered by a conduction layer 2. A connection region 15a, is doped in a highly p-type fashion, and is an upper part of the lateral cladding layer 15 (see FIG. 4). The intermediate layer 6 is oppositely doped, that is to say in an n-type fashion. The parts of the absorber layer of length S' together with the interruption adjacent thereto of the length T form a period P of the periodic structure. Contacts 1, 9 and 11 are used for the electrical connection. The lateral cladding layer 15 is doped in an n-type fashion and produces the conductive connection between the intermediate layer 6 and the lateral contact 11 via a further intermediate layer 12, an etching stop layer 13 and a contact layer 14, which is doped in a highly n-type fashion. The current $I_a$ for generating laser radiation and the current $I_t$ for tuning are likewise illustrated. It may be seen in FIG. 4 that the waveguide layers 5 and 7 and the absorber layer 4 form an embedded web-type structure of a width W. This laser diode has the structure of a TTG (Tunable Twin Guide) diode, as is described in the above-mentioned U.S. Pat. No. 5,325,379. The respective sections of the absorber layer 4 are beveled here according to the invention, as illustrated in FIGS. 1b and 2, with the result that the boundaries or edges of the parts of the absorber layer 4 extend obliquely in the plan view relative to the longitudinal direction of the waveguide.

An alternative possibility for the tapering ends of the periodic structure producing the coupling results by virtue of the fact that the tapering or narrowing of the sections of the layer Δn' is present in the vertical in component 100" (See FIG. 5a). Such a vertical taper can be produced, for example, by means of dry etching at a temporally variable angle by using a shadow mask (at a distance from the layer to be etched). Another possibility is described in the two U.S. Pat. Nos. 4,932,032 and 4,944,838 and the corresponding European Published Document 0 411 816. In accordance with the direction of the view illustrated in FIG. 5a, FIG. 5b illustrates the part of the layer Δn' with the covered contours of the upper boundaries of these tapers (dashed lines). Thus, in this configuration, the boundaries of the layer Δn' are aligned at an angle to the direction of propagation of the modes which differs from the right angle perpendicular to the layer plane. In other words, the z-axis, shown in FIG. 5b, and a normal to such a boundary enclose an angle whose perpendicular projection onto a plane perpendicular to the layer plane differs from 0° and 180°. In the case of the embodiment of FIG. 1, the boundaries of the layer Δn are aligned at an angle to the direction of propagation of the mode, which differs from the right angle in the layer plane, that is to say the z-axis, as shown in FIG. 1b, and a normal to the boundary enclose an angle whose projection, perpendicular with respect to the layer plane, onto the layer plane is not 90°. As a result, the case is respectively included, in which tapers are present both in the lateral and in the vertical direction. It is, thus, possible to combine the embodiments of FIGS. 1 and 5 with one another. The boundary may not be a plane surface but can, for example, be cambered or rounded at the edges. The edge, shown in the top view of FIG. 1b, of a part of the layer Δn need not be rectilinear, as illustrated, but can, in a suitable way, be rounded or, for example, be curved in the shape of an S.

An alternative to the component according to the invention is provided by means of a graded composition of the semiconductor material at the point where no discontinuity is to occur in the refractive index, which, for example, in the embodiments of FIGS. 3 and 4 would be the absorber layer or the material surrounding this layer of the cladding layer 3. If the absorber layer in FIG. 3 is an InGaAs, the cladding layer can be an InP or at least an element arranged between the parts of this absorber layer 4, an InGaAsP. The composition of the semiconductor mixed crystals can then be undertaken so as to produce a gradual transition between the materials of the cladding layer 3 and the parts of the absorber layer 4 The graded composition of the semiconductor material produces a corresponding gradual change in the effective refractive index.

A possible production method uses the different growth rates of the semiconductor materials of which the mixed crystal is composed and these growth rates are dependent on the width of the mask opening. If use is made of a mask having a slot-shaped opening which widens toward the edge of the mask, the result in the case of epitaxial growth in the region of the slot-shaped opening is a higher growth rate, which decreases continuously outward down to the growth rate on the unmasked surface. Apart from the vertical tapering and a lateral widening corresponding to the shape of the mask opening, in the region of the widening of the mask opening, the layer, which is grown on is given a grating in the composition of the semiconductor mixed crystal.

The embodiment of FIG. 5 can, as indicated, be specifically configured so that the periodically structured layer Δn' comprises a plurality of layers, which are arranged vertically one above the other and form the layer Δn' in their totality. These materials can have a material composition differing from one another and, moreover, can be separated from one another by thin etching stop layers. Such a multilayered structure renders it possible, by means of a stepwise etching of the tapered parts of the layer Δn', to obtain not only the changes in the vertical dimension which occur in the longitudinal direction of the waveguide but, in addition, to obtain multiple stepped changes in the effective refractive index by means of a stepwise arrangement of layers with different material composition. The combination of the lateral varying dimensions of the layer Δn, as in the exemplary embodiment of FIG. 1, with a varying material composition in the longitudinal direction of the waveguide is also possible.

The principles described here with the aid of the exemplary embodiments can be applied at all points in a component having codirectional coupling at which discontinuous changes in the effective refractive index are to be avoided. This can be the case, for example, where there is a transition between active and passive regions of the component. A configuration, such as described above for the part of the periodically structured layer (Δn or 4), can, for example, be present only at edges of a grating provided for the coupling. The edges of the grating, which are present in the direction of propagation of the modes, are then, for example, arranged obliquely relative to this direction of propagation. The discontinuities in the refractive index provided and required along the grating remain uninfluenced thereby. Again, it is possible in this case to undertake the lateral bounding of the grating conventionally, but to provide a graded composition of the semiconductor material between the grating and the semiconductor material which is adjacent in the direction of propagation of the modes.

Parts or portions of the compensation layer, in which it is possible to keep the real part of the effective refractive index constant, can be provided between the parts of the absorber layer 4 in the example of FIG. 3 or the periodical structured layer Δn (see the portions 40 in FIG. 1a), which produces a change in the effective refractive index along the waveguide layers. The means according to the present invention for continuously adjusting the effective refractive index can then be present in this compensation layer or, if necessary, an additional layer which is arranged, for example, vertically with respect to the periodically structured layer Δn.

Although various minor modifications may be suggested by those versed in the art, it should be understood that we wish to embody within the scope of the patent granted hereon all such modifications as reasonably and properly come within the scope of our contribution to the art.

We claim:

1. In an optoelectric component having two waveguide layers and a layer of periodic structure, with portions of one refractive index separated by portions of a second refractive index along a direction of propagation of the modes in the waveguide layers, which layers, are arranged parallel to one another and are dimensioned so that codirectional coupling is produced between modes guided in the waveguide layers, the improvement comprising means for gradually changing the effective refractive index in the direction of propagation of the modes at each boundary surface between portions of the periodic structure so that discontinuities, which are not required for the coupling and are therefore undesirable, in real parts of the refractive index, which parts are decisively effective for wave guidance of the modes, are avoided.

2. In an optoelectric component according to claim 1, wherein the means for gradually changing provides a continuous change in the lateral dimensions of the periodic structure so that each boundary surface extending transverse to direction of propagation of the modes in the component is aligned with respect to the direction of propagation at an angle in a plane of the layer of periodic structure, which is different from a right angle.

3. In an optoelectric component according to claim 1, wherein the means for gradually changing comprises a continuous change in the vertical dimensions of the periodic structure so that each boundary surface extending transverse to the direction of propagation of the modes in a relevant layer of the waveguide layers is aligned with respect to the direction of propagation at an angle perpendicular to a plane of the layer of periodic structure, which angle differs from a right angle.

4. In an optoelectric component according to claim 1, wherein the means for gradually changing the effective refractive index is produced by varying an average material composition of the portion over a cross section of the layer of periodic structive in accordance with the change in the direction of the propagation of the modes.

5. In an optoelectric component according to claim 1, wherein the waveguide layers are arranged vertically with respect to each other and parallel to one another and are separated by an intermediate layer located between the waveguide layers, so that a second current injection is possible into each of the two waveguide layers, the periodic structure comprises an absorber layer periodically interrupted in the longitudinal direction of the waveguide layers being arranged vertically with respect to the waveguide layers and parallel to the waveguide layers, and the means for gradually changing varies the periodic interruptions in the absorber layer in the direction of propagation in the waveguide layers.

6. In an optoelectric component according to claim 5, wherein the means for gradually changing is a change of a material composition of the absorber layer.

7. In an optoelectric component according to claim 5, wherein the means for gradually changing is a multiple-step change in the boundary surface of each of the periodic interruptions of the absolver layer.

8. In an optoelectric component according to claim 5, wherein the means for gradually changing is a continuous change at each boundary surface extending in the direction of propagation, which is selected in one of the vertical and lateral dimensions.

9. In an opto-electronic component according to claim 5, in which the portions of a compensation layer are respectively present in the interruptions between the absorber layer in order as far as possible to keep the real parts of the effective refractive index constant along the waveguide layer.

10. In an optoelectric component according to claim 9, in which the portions of the absorber layer have lateral tapers in the direction of propagation of the modes.

11. In an optoelectric component according to claim 9, wherein the portions of the absorber layers are ternary semiconductor materials and the portions of the compensation layers are quaternary semiconductor materials, and wherein a gradual transition occurs between the materials of the portions is produced by means of a graded composition of the semiconductor mixed crystal.

* * * * *